United States Patent [19]

Taki et al.

[11] Patent Number: 4,779,059
[45] Date of Patent: Oct. 18, 1988

[54] CURRENT MIRROR CIRCUIT

[75] Inventors: Yoichiro Taki; Yoshiaki Kawada, both of Tokyo, Japan

[73] Assignee: NEC Corporation, Tokyo, Japan

[21] Appl. No.: 69,737

[22] Filed: Jul. 6, 1987

[30] Foreign Application Priority Data

Jul. 4, 1986 [JP] Japan .................. 61-156302

[51] Int. Cl.⁴ .............................................. H03F 3/45
[52] U.S. Cl. .................................. 330/257; 323/316; 330/288
[58] Field of Search ................ 330/257, 288; 323/315, 323/316

[56] References Cited

U.S. PATENT DOCUMENTS 3,922,614 11/1975 Van de Plassche ................ 330/257

Primary Examiner—James B. Mullins
Attorney, Agent, or Firm—Sughrue, Mion, Zinn, Macpeak & Seas

[57] ABSTRACT

A current mirror circuit including an operational amplifier connected to transistors of the current mirror circuit such that operating points of the transistors, that is, the emitter electrodes, are at the same potential. Thus, resistors connected between those emitters and an output of the operational amplifier may be increased even when the transistors are implemented in an integrated circuit. As a result, even with this configuration, current mirror accuracy may be improved.

3 Claims, 1 Drawing Sheet

000# CURRENT MIRROR CIRCUIT

BACKGROUND OF THE INVENTION

This invention relates to a current mirror circuit, and more particularly to a current mirror circuit which is used at an output stage of a multiplier or the like.

A current mirror circuit has been used at an output stage of a multiplier or the like for converting output currents of a differential amplifier to a single-ended output current. As disclosed in the "BIPOLAR AND MOS ANALOG INTEGRATED CIRCUIT DESIGN" by Alan B. Grebene, published from John Wiley & Sons, Inc. pp176-180, a conventional current mirror circuit has two transistors whose base electrodes are connected to each other, and two resistors having the same resistance and connected to emitter electrodes of the respective transistors. The current mirror accuracy depends on the resistance and becomes higher as resistance increases. It is preferable for the resistor to have a higher resistance.

In practical use, the transistors in such current mirror circuits are implemented as an integrated circuit. However, where the transistors in the integrated circuit have a lower break-down voltage, a power source of higher voltage cannot be used. When a lower-voltage power source (for example, ±5V), an increase in resistance causes a voltage drop by the resistor, resulting in a saturation of the transistor. In other words, it is impossible in practice to increase the resistance. As a result, current mirror accuracy can not be improved.

SUMMARY OF THE INVENTION

It is, therefore, an object of this invention to provide a current mirror circuit having an improved current mirror accuracy, even when a transistor having a lower break-down voltage is used in an integrated circuit.

According to this invention, there is provided a current mirror circuit comprising: first and second transistors, base electrodes of said first and second transistors being connected to each other; an operational amplifier having inverted and non-inverted input terminals and an output terminal, said inverted input terminal being connected to an emitter electrode of said first transistor; a first resistor disposed between said output terminal of said operational amplifier and said emitter electrode of said first transistor; and a second resistor disposed between said output terminal of said operational amplifier and an emitter electrode of said second transistor.

BRIEF DESCRIPTION OF THE DRAWINGS

Other features and advantages of this invention will be apparent from the following description of a preferred embodiment of this invention taken in conjunction with the accompanying drawing, wherein.

DETAILED DESCRIPTION OF A PREFERRED EMBODIMENT

Figure 1:
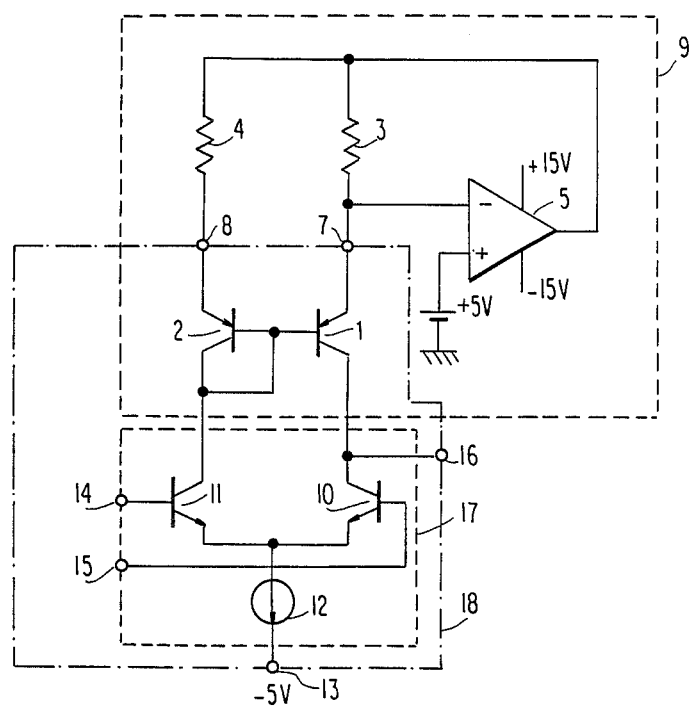
FIG. 1 is a circuit diagram of an embodiment of this invention.

Referring to FIG. 1, the embodiment of this invention comprises a current mirror circuit 9 and a multiplier 17. The current mirror circuit 9 is composed of: first and second transistors 1 and 2 whose base electrodes are connected to each other; first and second external resistors 3 and 4 connected to emitter electrodes of the first and second transistors 1 and 2, respectively; and an operational amplifier 5 having an inverted input terminal connected to the emitter electrode of the first transistor 1, a non-inverted input terminal connected to a reference voltage source 6 of +5V, and an output terminal connected to the first and second external resistors 3 and 4.

The multiplier 17 is composed of: third and fourth transistors 10 and 11; a current source 12; a terminal 13 to which a negative power source is connected; differential input terminals 14 and 15; and a multiplier output terminal 16.

The first to fourth transistors 1, 2, 10, and 11, and the current source 12 are included in an integrated circuit (IC) 18 having terminals 7 and 8 connected to the emitter electrodes of the first and second transistors 1 and 2, respectively.

Multiplier output currents generated at the output stage of the multiplier 17 are converted to a single-ended output current. The potential of the terminal 7 of the IC 18 is substantially equal to the voltage (+5V) of the reference voltage source 6 in response to the operation of the operational amplifier 5. Further, the potential of the terminal 8 of the IC 18 is equal to that of the terminal 7, that is, substantially equal to +5V. Thus, the current mirror circuit 9 can operate without changing the operating points of the terminals 7 and 8, because of variation of the output voltage of the operational amplifier 5 to which the power voltages of ±15V are applied. This means that the resistance of the external resistors 3 and 4 can be increased even when the break-down voltage for the transistors 1 and 2 included in the IC 18 is low, thereby to improve the current mirror accuracy. Furthermore, since the operating points of the terminals 7 and 8 are not varied, it is possible to prevent the deterioration in the current mirror accuracy.

As described above, according to this invention, the operational amplifier makes the current mirror circuit to use the external resistors having a higher resistance, thereby to improve the current mirror accuracy.

What is claimed is:

1. A current mirror circuit comprising:
    first and second transistors, each having a base electrode, a collector electrode, and an emitter electrode, said base electrodes of said first and second transistors being connected to each other;
    an operational amplifier having inverted and non-inverted input terminals and an output terminal, said inverted input terminal being connected to said emitter electrode of said first transistor, and said non-inverted terminal being connected to a reference voltage;
    a first resistor disposed between said output terminal of said operational amplifier and said emitter electrode of said first transistor; and
    a second resistor disposed between said output terminal of said operational amplifier and said emitter electrode of said second transistor.

2. The current mirror circuit as claimed in claim 1, wherein said first and second transistors are included in an integrated circuit, and said first and second resistors are connected to terminals of said integrated circuit.

3. The current mirror circuit as claimed in claim 1, further comprising a multiplier connected to said collector electrodes of said first and second transistors, said multiplier including third and fourth transistors and a current source.

* * * * *

UNITED STATES PATENT AND TRADEMARK OFFICE
CERTIFICATE OF CORRECTION

PATENT NO. : 4,779,059
DATED : October 18, 1988
INVENTOR(S) : Yoichiro TAKI et al It is certified that error appears in the above-identified patent and that said Letters Patent is hereby corrected as shown below:

COLUMN 1, LINE 27   After "(for example, ±5V)" insert -- is used, --.

Signed and Sealed this

Ninth Day of May, 1989

Attest:

DONALD J. QUIGG

Attesting Officer

Commissioner of Patents and Trademarks